(12) United States Patent
Wang et al.

(10) Patent No.: US 6,803,662 B2
(45) Date of Patent: Oct. 12, 2004

(54) LOW DIELECTRIC CONSTANT MATERIAL REINFORCEMENT FOR IMPROVED ELECTROMIGRATION RELIABILITY

(75) Inventors: Ping-Chuan Wang, New Paltz, NY (US); Kevin H. Brelsford, Hyde Park, NY (US); Ronald Filippi, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/026,117

(22) Filed: Dec. 21, 2001

(65) Prior Publication Data

US 2003/0116855 A1 Jun. 26, 2003

(51) Int. Cl.[7] .......................... H01L 23/48; H01L 23/52; H01L 29/40
(52) U.S. Cl. ....................... 257/774; 257/734; 257/750; 257/758; 257/759
(58) Field of Search ................................. 257/750, 758, 257/759, 774, 734

(56) References Cited

U.S. PATENT DOCUMENTS

| | | | | |
|---|---|---|---|---|
| 5,309,629 A | * | 5/1994 | Traskos et al. | 174/262 |
| 5,569,569 A | * | 10/1996 | Goto et al. | 216/51 |
| 5,932,491 A | * | 8/1999 | Wald et al. | 438/734 |
| 6,043,144 A | * | 3/2000 | Kuo | 438/612 |
| 6,100,590 A | * | 8/2000 | Yegnashankaran et al. | 257/758 |
| 6,124,198 A | * | 9/2000 | Moslehi | 438/622 |
| 6,232,662 B1 | * | 5/2001 | Saran | 257/734 |
| 6,252,290 B1 | * | 6/2001 | Quek et al. | 257/522 |
| 6,297,145 B1 | * | 10/2001 | Ito | 438/619 |
| 6,313,024 B1 | * | 11/2001 | Cave et al. | 438/598 |
| 6,368,939 B1 | * | 4/2002 | Sasaki | 438/421 |
| 6,413,852 B1 | * | 7/2002 | Grill et al. | 438/619 |
| 6,472,740 B1 | * | 10/2002 | Engel et al. | 257/704 |
| 6,524,926 B1 | * | 2/2003 | Allman et al. | 438/387 |
| 2002/0025417 A1 | * | 2/2002 | Chisholm et al. | 428/209 |
| 2002/0090814 A1 | * | 7/2002 | Inoue et al. | 438/672 |
| 2002/0132468 A1 | * | 9/2002 | Wong | 438/627 |
| 2002/0163029 A1 | * | 11/2002 | Dimecker et al. | 257/306 |

* cited by examiner

*Primary Examiner*—Amir Zarabian
*Assistant Examiner*—Ida M. Soward
(74) *Attorney, Agent, or Firm*—Lisa J. Ulrich

(57) ABSTRACT

A reinforced semiconductor interconnect structure, having the following components:

(1) A first metal interconnect disposed in a first material, the first metal interconnect having a line portion and at least one via portion, an anode section and a cathode section, the via portion of the first metal interconnect located in the anode section, the line portion of the first metal interconnect having a top, bottom and terminus side, wherein at least a part of the bottom side of the line portion of the first metal interconnect in contact with the first dielectric; and (2) a first reinforcement disposed in the first material, the first reinforcement in contact with at least the bottom side of the first metal interconnect, the first reinforcement comprising a second material, the second material being electrically nonconductive; and wherein the second material has a greater mechanical rigidity than the first material.

18 Claims, 5 Drawing Sheets

LOW DIELECTRIC CONSTANT MATERIAL REINFORCEMENT FOR IMPROVED ELECTROMIGRATION RELIABILITY

FIELD OF THE INVENTION

This invention is directed to the field of semiconductor manufacturing and more particularly to a method of reinforcing mechanically compliant dielectrics with mechanical supports.

BACKGROUND OF THE INVENTION

There are many factors which must be considered when designing the layout for a semiconductor interconnect system. Interconnect systems comprise different components. Two such components are the interlevel dielectrics and the metal line/via structures that are formed. For example, as ever increasing chip speeds are contemplated more complex interlevel dielectrics are being considered. The dielectrics are typically polymers that tend to have the advantage of lower dielectric constants (low k). Some of the low k dielectrics, which also have several advantages for processing purposes, do not have the mechanical integrity of their higher dielectric constant counterparts. By mechanical integrity it is meant that the low k dielectrics are mechanically compliant materials with a small Young's modulus. The mechanical integrity of the chosen low k dielectric can effect the speed and reliability of the overall semiconductor chip.

There are a number of different ways that a metallization can be formed. Two of the more popular ways are reactive ion etching (RIE) and damascene processing. In RIE, the metallization is first deposited. The metal is then etched and voids created. Possible deposition methods include physical vapor deposition (PVD) and chemical vapor deposition (CVD). The dielectric is then deposited and the voids filled. The dielectric can be deposited by any means known in the art. Possible deposition methods include chemical vapor deposition (CVD), plasma enhanced CVD, high density plasma CVD, or spin-on glass process.

Damascene processes are widely used in the manufacture of semiconductor devices. Generally, in a damascene process, a dielectric layer is first deposited on a substrate, a portion of the dielectric layer is then removed by an etching process in accordance with a mask pattern, the etched areas in the dielectric layer are lined with a barrier metal and then filled with a metal, and finally the excess liner and metal deposited over the dielectric layer are removed in a planarization process. By this method, metal features such as vias or lines are formed on a substrate.

Vias and lines can be formed in separate damascene processes, known as single damascene. For example, to form a layer of metal lines on a substrate, a dielectric layer is first deposited, then a portion of the dielectric layer is etched according to a mask pattern which corresponds to the desired line pattern, a metal liner is then deposited on the dielectric layer and in the etched line areas in the dielectric layer, these etched line areas are then filled with a metal, and finally the excess metal and liner on top of the dielectric layer is removed in a planarization process. A layer of vias is formed in a similar process, except that the mask pattern corresponds to the desired via pattern. Thus, to form a layer of vias and lines, two metal fill steps and two metal planarization steps are required.

In the electronics industry, there is a current trend toward using more cost effective dual damascene in the fabrication of interconnection structures. In a dual damascene process, both the via and the line are formed in the same damascene process. In one way to form the via and the line in the same damascene process, a thicker dielectric layer is first deposited on a substrate, the dielectric layer is then etched according to a mask pattern which corresponds to both the desired via pattern and the desired line pattern, a liner is then deposited on the dielectric layer and in the etched areas in the dielectric layer, these etched areas are then filled with a metal, and the excess metal and liner is removed by a planarization process. This dual damascene process therefore reduces the number of costly metal fill and planarization steps. It should be realized that in some dual damascene processes the via and line patterns can be defined in separate lithography and etch steps.

However, it is well known that interconnection structures are susceptible to failure caused by electromigration effects. For example, FIG. 1 illustrates a cross sectional view of a wafer stack 100 formed using a conventional dual damascene process. The wafer stack 100 includes a substrate 102, an oxide layer 104, a metal layer 106, a dielectric layer 108, a liner 110, a metal via 112 and a metal line 114. The metal via 112 and metal line 114 are formed by a dual damascene process in which the dielectric layer 108 is first deposited on top of the metal layer 106, the dielectric layer 108 is then etched to form via 112 and trench 114 according to a mask pattern which defines the desired via and line pattern, the liner 110 is deposited on the dielectric layer 108 and in the etched portions of the dielectric layer 108, a metal is then deposited in the via 112 and trench 114, and finally the excess metal and liner on top of the dielectric layer 108 are removed by a planarization process.

In this wafer stack configuration, when an electric potential is applied across the metal via 112 and metal line 114, the electric potential causes an electromigration effect in the metal via 112 and metal line 114. Specifically, the electric potential causes one portion of the interconnect structure to be a cathode and the other portion to be an anode. While there is no demarcation in a metal line for the end of the cathode end and the beginning of the anode end, for the purposes of this invention the anode end of the line shall be equal to at most 50% of the line length. The electric potential between the cathode and the anode causes a current flow from the anode end to the cathode end through metal via 112 and metal line 114. Since the direction of electrons is opposite of the direction of current flow, the electron current is from the cathode end of the metal via 112 toward the anode end of the metal line 114. In this process, the moving electrons generate an "electron wind" which pushes or forces the metal atoms in the direction of the electrons from the metal via 112 near the cathode to the metal line 114 near the anode. The liner 110 prevents the atoms in the metal layer 106 from migrating to the metal via 112 and metal line 114. As a result, a void 116 forms near the cathode in the metal via 112. The formation of this void often leads to catastrophic failure of the device. The failure is catastrophic because the liner 110 at the bottom of the via 112 is often thinner than in the line and therefore is unable to shunt the current across the void.

Also, metal atoms tend to pile up near the anode end of the interconnects during electromigration. The accumulation of metal atoms creates mechanical compressive stress which has the potential of creating cracks in the surrounding dielectric materials. As a result, the electromigrated metal atoms tend to extrude out through the cracks in the dielectric. The extruded material may then contact neighboring interconnects causing circuit failure (short circuit).

Void (and extrusion) formation due to electromigration is a well known phenomenon. Several methods have been proposed to counteract this electromigration effect in interconnects and thereby prevent void formation. For example, in IBM Technical Disclosure Bulletin Vol. 31, No. 6 (1988), tungsten (W) links are interposed periodically in long aluminum-copper (Al—Cu) lines or minimum groundrule features interfacing contact pads. These tungsten links form a physical barrier to the Al—Cu atoms being transported between the cathode to the anode. As another example, U.S. Pat. No. 5,470,788 to Biery et al. proposes interposing segments of Al with segments of refractory metal such as W.

Each of these methods is based on the existence of an electromigration threshold condition. Threshold conditions occur in adjacent levels of interconnections if an electrical current is supplied through leads of materials in which a diffusion barrier exists. The physical origin of the electromigration threshold is the build-up of backstress. As interconnection metal atoms pile up against the diffusion barrier leads, this backstress counteracts the electromigration driving force. A steady-state condition arises in situations where the backstress exactly balances the electromigration driving force. Under this condition, no further electromigration damage occurs.

The equation for the net electromigration flux ($J_{em}$) which is valid for metal lines for any length within a given dielectric, is given by the following equation:

$$J_{em} = D/kT[Z^*ej\rho - (\delta\sigma/\delta x)\omega]$$ where:

D=diffusivity of metal
k=Boltzmann's constant
T=temperature
$Z^*$=effective ion charge
e=electron charge
j=current density
$\rho$=resistivity of metal
($\delta\sigma/\delta x$)=mechanical stress gradient over interconnect
$\omega$=atomic volume of metal $Z^*ej\rho$ represents the electron wind force discussed above. The ($\delta\sigma/\delta x$)$\omega$ term represents the stress driven backflow discussed above. While the electron wind force value is independent of line length, the stress driven backflow term is dependent on dielectric mechanical strength and line length. For example, as the mechanical strength of the dielectric decreases the stress driven backflow decreases. Also, as the line length increases, the stress driven backflow decreases. Therefore, it can be seen that one method of reducing the $J_{em}$ when premature electromigration failure is a concern would be to increase the stress driven backflow. Thus, there remains a need for a structure that balances the need for increasing the stress driven backflow and/or mechanical strength of the dielectric when using low k materials and/or long metal lines.

SUMMARY OF THE INVENTION

It is therefore an object of the present invention to provide a structure to mechanically reinforce the anode portion of a metallization/dielectric system.

It is a further object of the present invention to provide a structure that increases the stress driven backflow in a low dielectric constant material.

In accordance with the above listed and other objects, we claim a reinforced semiconductor interconnect structure, comprising:

A first metal interconnect disposed in a first material, the first metal interconnect having a line portion and at least one via portion, an anode section and a cathode section, the via portion of the first metal interconnect located in the anode section, the line portion of the first metal interconnect having a top, bottom and terminus side, wherein at least a part of the bottom side of the line portion of the first metal interconnect in contact with the first dielectric;

a first reinforcement disposed in the first material, the first reinforcement in contact with at least the bottom side of the first metal interconnect, the first reinforcement comprising a second material, the second material being electrically nonconductive; and wherein the second material has a greater mechanical rigidity than the first material.

DESCRIPTION OF THE PREFERRED EMBODIMENTS

Interconnect structures are very precisely placed in current technology semiconductor devices. The complexity of devices and the need to minimize the overall dimensions of all portions of a chip make it necessary to contemplate the ramifications and implications of the functioning of each pathway and material. Since materials engineers have long sought to use interlevel dielectric materials with low (lower) dielectric constants for a myriad of reasons, modifications have needed to be developed to ensure the electrical and mechanical integrity of other components of the semiconductor chips. As stated supra, the electromigration flux of metal interconnects ($J_{em}$) is changed, usually detrimentally, by the change to low k dielectric materials (mechanically compliant materials). It is therefore advantageous to increase the stress driven backflow which generally has the effect of reducing the net electromigration flux. In a preferred embodiment, the modifications made to increase the stress driven backflow would be balanced by the need to minimize any increases to the dielectric constant of the interlevel dielectrics.

Figure 1:
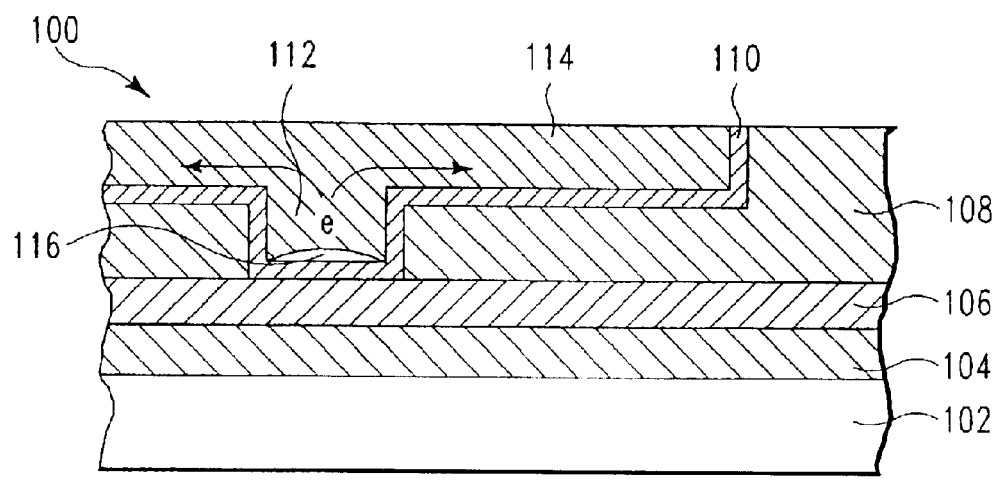
FIG. 1 is a cross section of a prior art metal interconnect structure.
Figure 2:
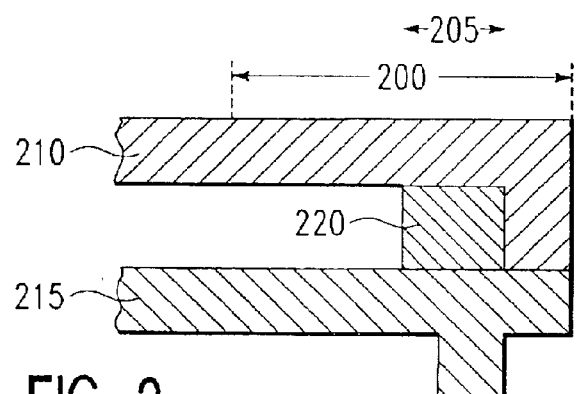
FIG. 2 is a cross section of one embodiment of the instant invention.

As shown in FIG. 2 generally, the current level (n level) interconnect structure, 210, of the instant invention is reinforced by a reinforcement, 220, at a portion 205 of the anode end 200 of the interconnect only. The reinforcement, 220, and the interconnect structure, 210, are in contact with the (n−1) level interconnect, 215. The reinforcement is not designed to establish electrical communication between different interconnect levels. That is to say that the reinforcement can be an additional contact to the current level metal interconnect. Since the reinforcement is not intended to provide electrical communication between two different interconnect levels the designer is therefore not restricted to use materials or locations that would enhance electrical communication when providing the reinforcement. The purpose of the reinforcement is to provide mechanical support for the anode end of a metal interconnect in a mechanically compliant dielectric.

Figure 3:
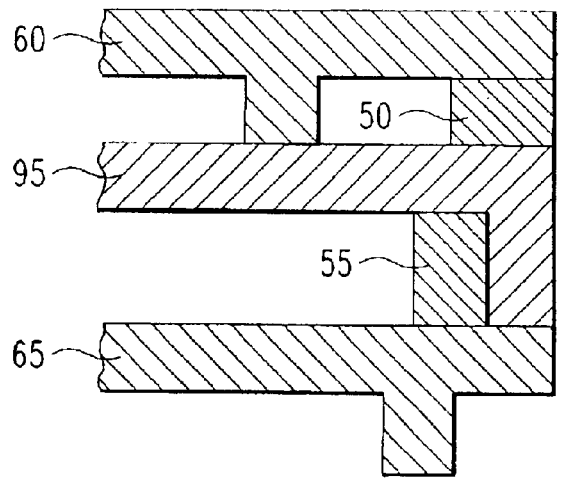
FIG. 3 is a cross section of another embodiment of the instant invention.
Figure 5A:
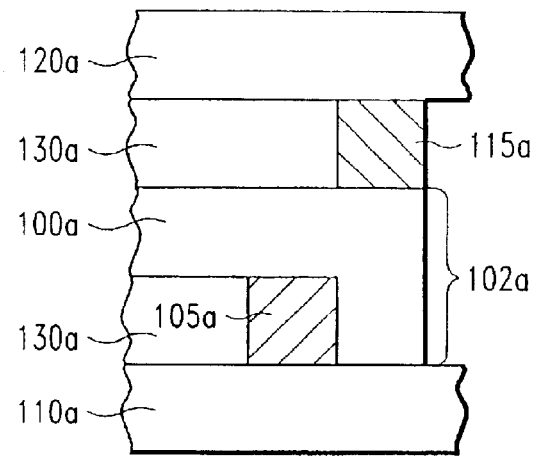
FIGS. 5a–c are cross-sections of alternate embodiments of the invention.
Figure 5B:
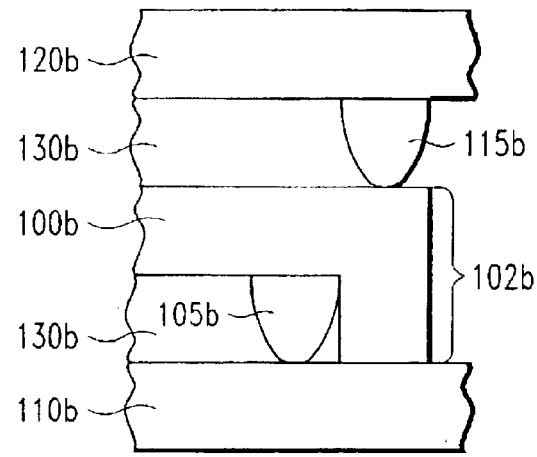
Figure 5C:
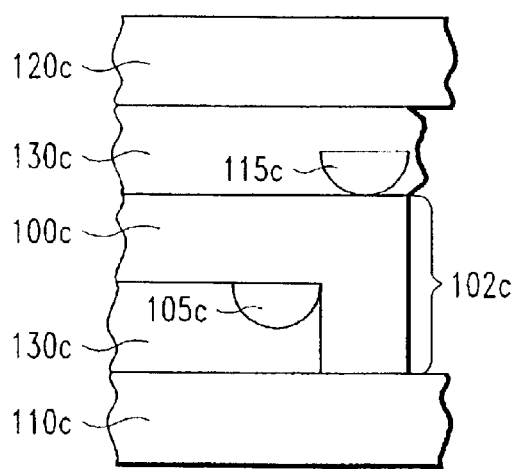

The reinforcement can be of any shape or material and formed by any means known in the art. However, as stared earlier, the reinforcement should not alter the electrical pathways contemplated by the chip designers. For example, as shown in FIG. 3, the reinforcement could be on only one side, 50 (top) or 55 (bottom) of the current level (n level) metallization 95 or the reinforcement could be on both sides 50 and 55 of the current level metallization 95. Also, as shown in FIG. 3 the reinforcement could contact higher (n+1) 60 and/or lower (n−1) 65 levels of metallization to enhance support. The instant invention is not restricted to reinforcements that contact higher and/or lower levels of metallization. Additionally, the instant invention is not restricted to a specific design. For example, the reinforcement could be any of the shapes shown in FIGS. 5a–c, which show different shapes for the reinforcement. In each of FIGS. 5e–5c, the current level metallization (level n), 100a–c, has a reinforcement at the anode end, 105a–c respectively, that lies between the current level metal and the prior level metallization 100(a–c). The inventors contemplate many different shapes that would also be feasible and do not mean the scope of the invention to be restricted to the shapes shown in FIG. 5. As can be seen from FIG. 5c it is not necessary that the reinforcement, 105c, contact any of the metallization of the preceding layers, it may terminate in the dielectric, 130. It is not necessary that the reinforcement maximize or optimize the stress driven backflow. It is only necessary that the stress driven backflow be sufficient to reduce $J_{em}$ such that the lack of stress driven backflow is not the significant cause of electromigration failure. Additionally, as shown in FIGS. 5a–5c, reinforcement may also be placed in the next level of dielectric, 120(a–c). The reinforcements 115a–c in the next level (n+1) dielectric 130a–c, are in the proximity of the anode end 102(a–c) of the current level(n) metal interconnect. Reinforcements 115a–c are independent of reinforcements 105a–c. This invention contemplates that either one or both reinforcements 105 or 115 will be used.

The reinforcements can be formed from any material. It should be noted that the quantity of reinforcement material necessary is dependent on, at least, the material forming the metallization and the low k interlevel dielectric material. Preferably, the material would be significantly more mechanically rigid than the interlevel dielectric material. Even more preferably the reinforcement material would be sufficiently rigid to reduce the $J_{em}$. Even more preferably, the quantity and shape of reinforcement structure present in any one interlevel dielectric constant level would be selected such that minimal amounts of the reinforcement material were necessary to increase the stress driven backflow to an acceptable level. Most preferably, the quantity and shape of reinforcement structure present in any one interlevel dielectric constant level would be selected such that minimal amounts of the reinforcement material were necessary to increase the stress driven backflow to an optimal level.

Figure 6:
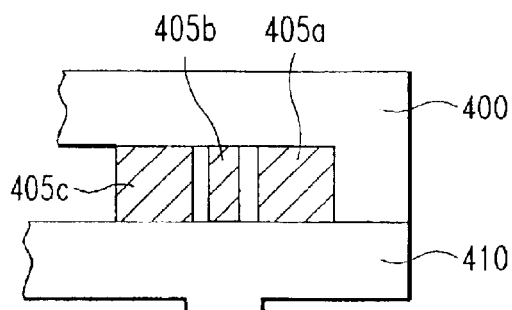
FIG. 6 is a cross section of yet another embodiment of the instant invention.

In each of FIGS. 5a–c the reinforcement 105a–c is shown in contact with the anode end via, 102 and the n−1 metallization and as a continuous body (regardless of shape). The inventors also contemplated that the reinforcement may not be continuous. Each "pillar" of reinforcement, 405a–c, is a discrete unit and at most one of them may be in contact with the n level anode end via, 400, as seen in FIG. 6. The shape of the reinforcement is not critical although a pillar is preferred. It remains an element of the instant embodiment that at most all of the length of the anode portion of the metal line contain reinforcements (at most 50% of the total line length). Additionally, the reinforcements, 405a–c, may or may not be in contact with the n−1 level metallization, 410. Also, the reinforcements do not have to be placed at regular intervals. However, it should be generally noted that for any given reinforcement material/shape chosen, the closer the at least one reinforcement is to the anode end of the current level metallization the greater the impact on the stress driven backflow. In a preferred aspect of this embodiment, at least one of the reinforcements would be in contact with the anode end via and would also be in contact with the n−1 level.

Figure 7A:
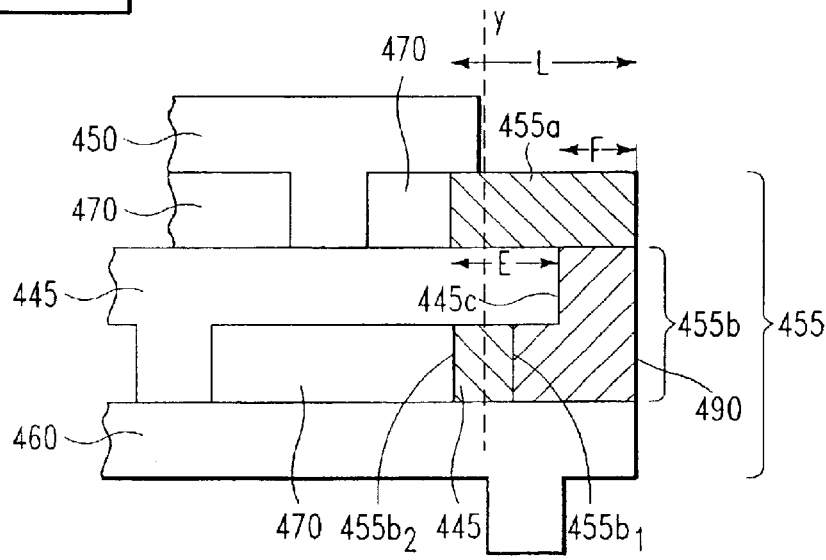
FIGS. 7a and 7b are cross sections of an embodiment of the instant invention.
Figure 7B:
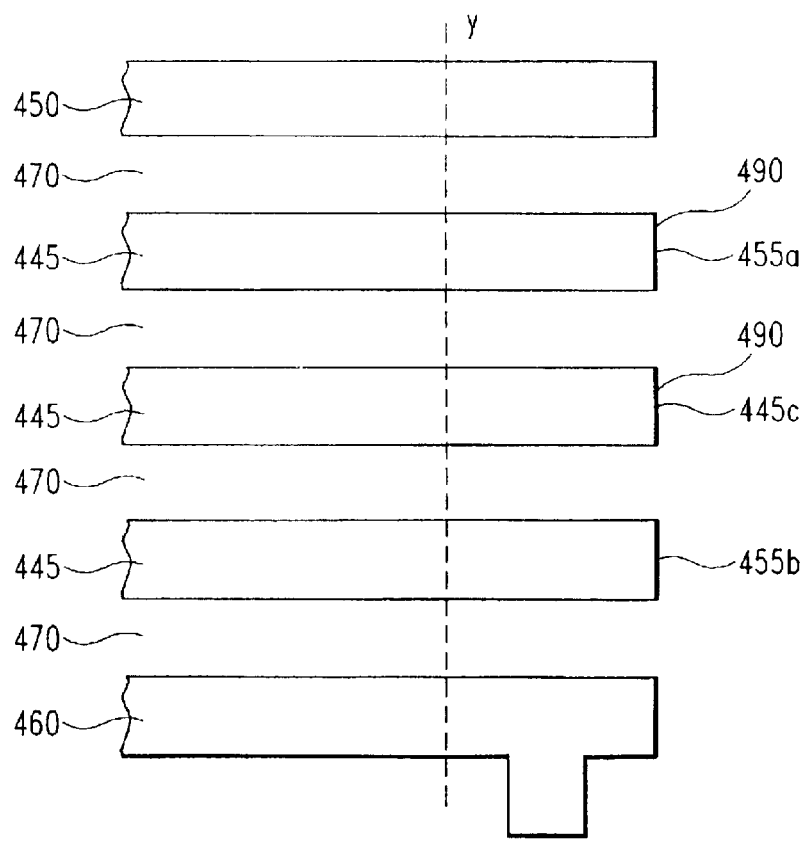
Figure 8:
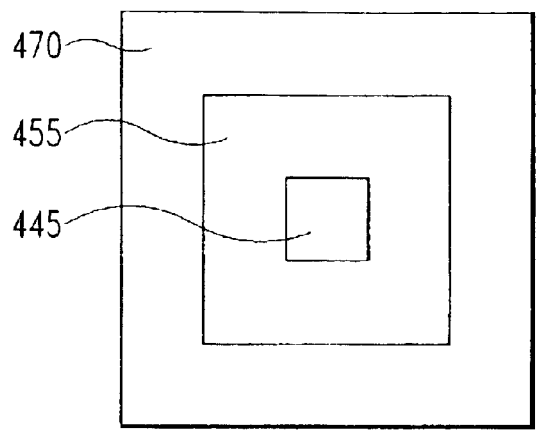
FIG. 8 is a cross section of the embodiment of FIG. 7a in a different plane.
Figure 9:
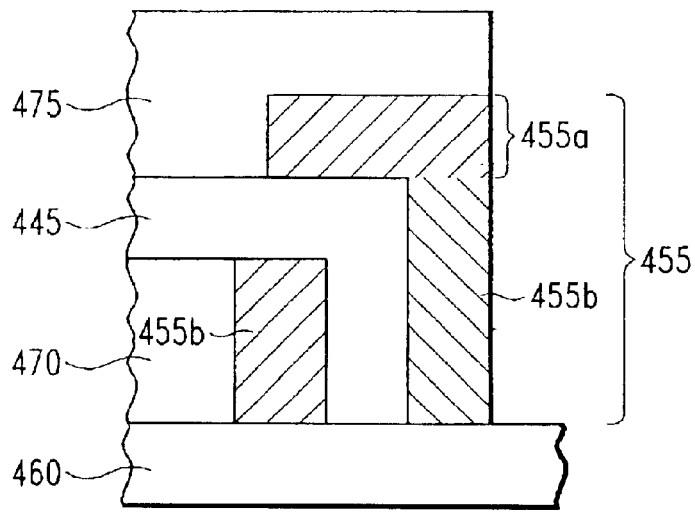
FIG. 9 is a cross section of another embodiment of the instant invention.
Figure 10:
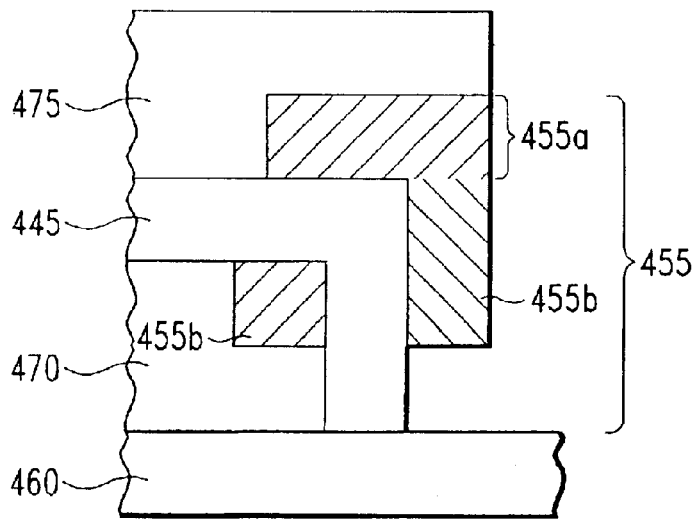
FIG. 10 is a cross section of another embodiment of the instant invention.

In another embodiment, shown in FIGS. 7a and 8, the reinforcement, 455, could "cap" the exposed end of the current level metallization. As shown in FIG. 7a, the terminus side, 445c, of the n level metallization, 445, would be in contact with the reinforcement. The reinforcement may or may not extend to contact the metallization from an n−1 level, 460. In a preferred embodiment, the reinforcement would contact the n−1 level and n+1 level metallizations. Also, in a preferred embodiment, the n+1 level portion of the reinforcement would be at least length, L, where L=E+F. E=the distance from the cathode side of the anode end via, 455b2, to the terminus of the anode end line, 445c. F=the thickness of the reinforcement material as measured from terminus of the anode end line to the end of the reinforcement material, 490. The reinforcement cap can still be said to be composed of n level, (455b) and n+1 (455a) level parts. The reinforcement, 455, would enclose the n level line, 445, in the dielectric, 470, as shown in FIG. 8. Alternate configurations for the cap are shown in FIGS. 9 and 10. In each of FIGS. 9 and 10, the n level interconnect, 445, has a cap 455, which comprises 1) an n level portion, 455b, of the reinforcement disposed in the n level dielectric, 470, and 2) an n+1 level portion, 455a disposed in the n+1 level of dielectric, 475. In another configuration based on FIG. 7a, and shown in FIG. 7b, the terminus of the anode line, 445c, would at least equal the end of the reinforcement 490. Therefore, the n level reinforcement, 455b would be under the n level metallization, 445 and the n+1 reinforcement, 455a would be over the n level metallization, 445. In the configuration shown in FIG. 7b, the reinforcements, 445a and 445b may or may not be in contact with any of the n−1, 460, n, 445, and n+1, 450, metallizations.

In yet another embodiment, as in an AC signal, it is possible for the current to flow in two directions (bi-directional) making each end an anode and a cathode, depending on the state of the device. In those instances it would not be possible to define an anode portion and a cathode portion definitively. In that case, the instant invention can still be used. Each end would then be reinforced using any of the shapes and sizes contemplated in other embodiments. However, the length of the reinforcement on each end would be at most 25% of the total line length. Additionally, it is preferred that each of the reinforcements start at the terminus of the line and extend toward the middle of the line. It is an important aspect of this embodiment that the two reinforcements not meet in the middle of the line.

Figure 4:
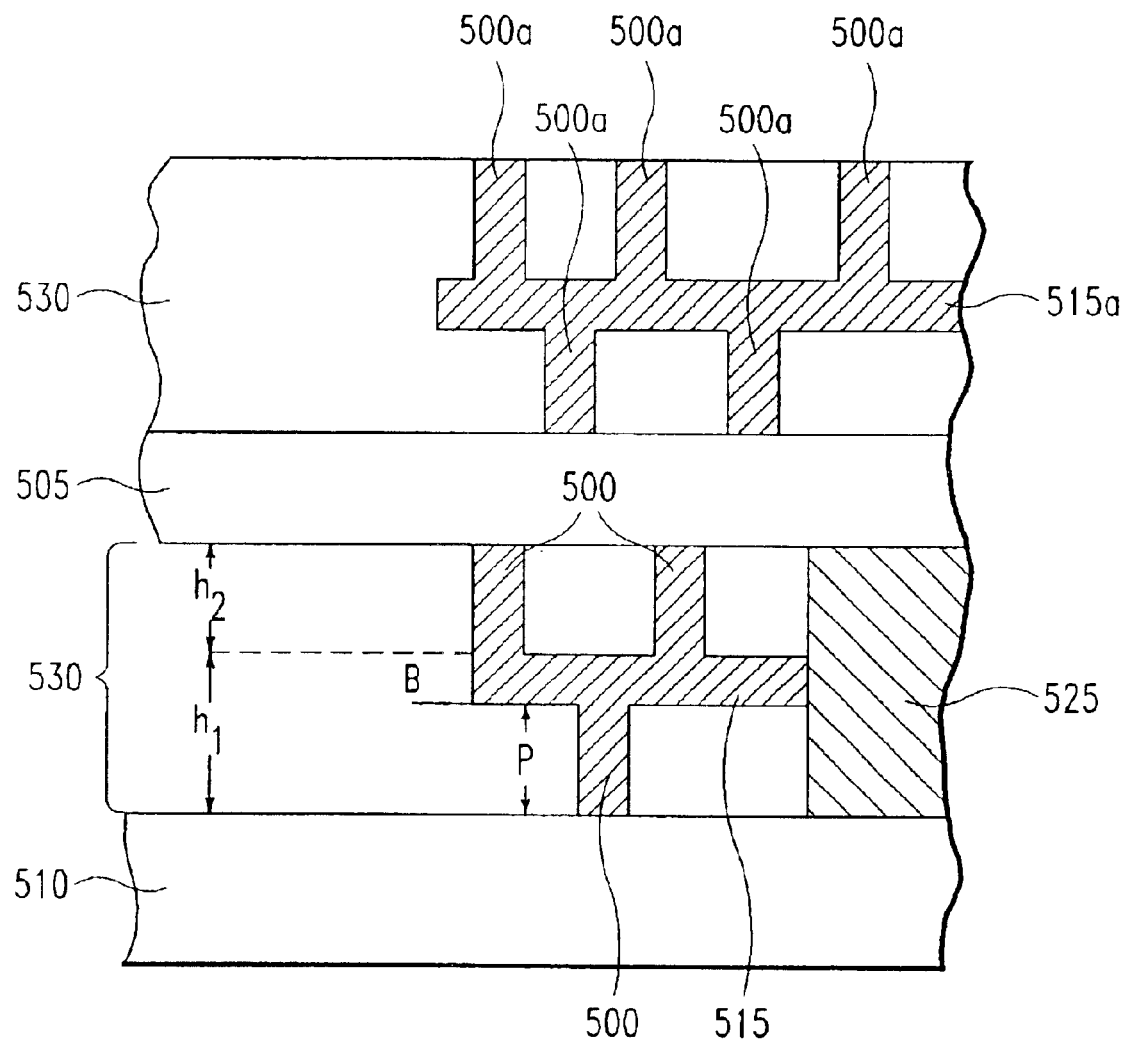
FIG. 4 is a cross section of a preferred embodiment of the instant invention.

FIG. 4 shows an example of a preferred structure, material and location for the reinforcement of the first embodiment. As shown in FIG. 4, the reinforcement is a series of pillars, 500, each less than the height of the interlevel dielectric, 530. Each of the pillars is in contact with at most one of the nth level 505, of metallization or n−1 level of metallization, 510. Each of the pillars is also in contact with a beam, 515, disposed entirely within the interlevel dielectric. The beam extends through the interlevel dielectric parallel to the line portions of the metallization. Preferably, the beams would not extend beyond the pillar farthest from the anode via. Also preferably one of the pillars or beams is in contact with the anode end via, 525.

Preferably, the reinforcements comprise a mechanically rigid material. More preferably, the chip designers would balance the need to reinforce the anode end of the metallization with the need to minimize the dielectric constant of the overall system. Most preferably, the dielectric material comprises polyimide, parylene, polytetraflouroethylene, Dow SiLK™ and Dow Cyclotene™ (trademarks of The Dow Chemical Company), Black Diamond™ (trademark of the Dow Corning Company), silicon-containing organic dielectric materials such as benzocyclobutene, hydrogen/alkane-SQ family material such as HSQ or MSQ (methyl sesquisiloxanes), nano-pore containing materials, and air gaps. However, the invention is not limited to the dielectrics listed above. Most preferably, the reinforcement material comprises silicon dioxide, fluoro-silicate glass, silicon nitride, silicon oxynitride ($SiO_xN_y$) and diamondlike carbon. Again, the invention is not limited to the reinforcement materials listed above.

As can be seen from FIG. 4 the reinforcement, 500$a$ and 515$a$ is also preferably present above the anode end of the nth level of the metal between the nth and the n+1 level metallizations (n+1 level metallization not shown). The structure of the reinforcement could be a duplicate of the structure 500, 515 in the dielectric, 530, between the nth and n−1 levels. However, the reinforcement in the over the anode end of the nth level need not be a duplicate of the reinforcement between the nth and n−1 levels. The reinforcements may be formed by any means in the art. One method of forming the reinforcements shown in FIGS. 4 and 7$a$ is described below.

The reinforcements in FIG. 4, the pillars and beams would require the use of at least two additional masks in addition to current processing methods. Currently, a dielectric of height (h) is deposited and a metal line/via structure is etched, usually using a dual damascene process. The line/via structure and the dielectric itself may or may not be lined and/or capped. The forming of the line/via structure is not an aspect of the instant invention.

With the addition of the instant invention, the dielectric layer would be deposited by any means known in the art. The following method references FIG. 4. The layer of dielectric deposited would be equal the height (h1) of the pillar contacting the n−1 metallization plus the beam. A first mask would then be used to etch the pillars and second mask would then be used to etch the beams (heights P and B respectively) creating voids in the dielectric material (h1=P+B). The voids would then be filled with the reinforcement material. A second layer of the dielectric would then be deposited having a height (h2). In a preferred embodiment h1+h2=h, h being the height of the dielectric in the non reinforced areas. That is to say, in a preferred embodiment the addition of the reinforcements does not affect the overall height of the dielectric layer it is formed in.

Once the second dielectric layer is formed, a third mask is used to create voids. Preferably the voids would be pillars and expose the previously formed beams. Again, the voids would be filled with the reinforcement material, having a height h2. Once the voids were filled the lines/vias would be formed by any means known in the art. In a preferred embodiment, the reinforcement would contact the anode via once formed. It should be noted that planarization of the reinforcement material may need to be done at intervals when practicing the method of the instant invention shown in FIG. 4. The formation of the reinforcement over the anode via (n+1 level) proceeds in much the same manner described above, except that the reinforcement may or may not be in contact with the metallization on that n+1 level. The inventors also contemplate that the reinforcement material could be deposited first and then etched to accommodate the n level dielectric and the n level metallization. Alternate reinforcement formation methods are contemplated and the inventors do not mean to be limited to the method described herein. For example, the anode via portion could be formed prior to the reinforcement formation. The anode line portion would then be formed after the second dielectric deposition. Conversely, the reinforcement could be formed prior to the deposition of either the dielectric or the metallization. Alternatively, a RIE process could be used and the combination of reinforcement/dielectric formation varied even more.

One method to create the structure shown in FIG. 7$a$ requires the addition of about two masks. First the dielectric for the n level would be deposited. A photolithographic masking process where the mask has an opening greater than the width of the n level part of the reinforcement, (see 455$b$ generally in FIG. 7$a$) would create the necessary void. The void would be filled with the reinforcement material. The reinforcement material in the n level would extend at least to the sidewall of the anode side 455$b_1$ of the anode via, 465, to be etched. The line/via would then be etched and filled with metal. The reinforcement would preferably be in contact with all sides of the n level line metallization. The etching of the line/via would remove part of the reinforcement material deposited, but the line/via would contact the reinforcement on all sides. Once the line/via is formed the dielectric for the n+1 layer would be deposited. The layer may or may not be the full thickness necessary for the formation of the n+1 metal line/via. A second mask would be employed to etch the top of the cap. (see 455$a$ in FIG. 7$a$). Reinforcement material would once again be used to fill the void created. Once the reinforcement material has been deposited (and planarized if necessary) the cap end reinforcement would be complete. A view of the line through the y plane is shown in FIG. 8. As can be seen in FIG. 8, the line, 445, is enclosed by the reinforcement, 455 in all planes, including the current level metallization. In a preferred embodiment, the reinforcement in the n+1 level would extend at least to the cathode side, 455$b2$ of the anode end via, 465 (see FIG. 7$a$). Also in a preferred embodiment, the is reinforcement in the n and n+1 level would extend at most the length of the anode section of the n level line. The inventors also contemplate that the reinforcement material could be deposited first and then etched to accommodate the n level dielectric and the n level metallization.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed:

1. A reinforced semiconductor interconnect structure, comprising:

A first metal interconnect disposed in a first material, the first metal interconnect having a line portion and at least one via portion, an anode section and a cathode section, the via portion of the first metal interconnect located in the anode section, the line portion of the first metal interconnect having a top, bottom and terminus side, wherein at least a part of the bottom side of the line portion of the first metal interconnect in contact with the first dielectric;

a first reinforcement disposed in the first material, the first reinforcement in contact with the anode section of the bottom side of the first metal interconnect, the first reinforcement comprising a second material, the second material being electrically nonconductive; and wherein the second material has a greater mechanical rigidity than the first material.

2. The structure of claim 1 wherein the first material is a low dielectric constant material, having a dielectric constant of at most about 4.3.

3. The structure of claim 1 wherein the second material is a high dielectric constant material.

4. The structure of claim 1 wherein the line portion of the first metal interconnect is in contact with the reinforcement.

5. The structure of claim 1 wherein the first reinforcement is in contact with the via portion of the first interconnect.

6. The structure of claim 1 further comprising a second metal interconnect disposed in a fifth material, the metal interconnect having a line portion and a via portion, the line portion having a top and bottom side, wherein at least a part of the top side of the line portion of the second metal interconnect is in contact with the first material and wherein the via portion of the first metal interconnect is in electrical contact with the second metal interconnect.

7. The structure of claim 6 further comprising a second reinforcement disposed in a third material, the second reinforcement in contact with the first metal interconnect and wherein the second reinforcement comprises a fourth material.

8. The structure of claim 7 further comprising a third metal interconnect disposed in the third material, the third metal interconnect having a line portion and at least one via portion, the third material deposited on at least the line and via portions of the first metal interconnect, the third metal interconnect in electrical contact with the first metal interconnect and wherein the second reinforcement is in contact with the third metal interconnect.

9. The structure of claim 7 wherein the second reinforcement is in contact with the via portion of the anode section of the first metal interconnect.

10. The structure of claim 8 wherein the second reinforcement is in contact with the third metal interconnect.

11. The structure of claim 1 wherein the first reinforcement is in contact with the via portion in the anode section of the first metal interconnect and the length of first reinforcement is at most 50% of the length of the first metal interconnect.

12. The structure of claim 10 wherein the first reinforcement is in contact with the via portion in the anode section of the first metal interconnect and the length of the first reinforcement is at most 50% of the length of the first metal interconnect and wherein the length of the second reinforcement is at most 50% of the length of the first metal interconnect.

13. The structure of claim 7 wherein the second and fourth materials are substantially the same.

14. The structure of claim 7 wherein the first third, and fifth materials are substantially the same.

15. The structure of claim 7 wherein the first, third and fifth materials are selected from the group consisting of polyimide, parylene, polytetraflouroethylene, SiLK™ and Cyclotene™, Black Diamond™, silicon-containing organic dielectric materials such as benzocyclobutene, hydrogen/alkane-SQ family material such as HSQ or MSQ (methyl sesquisiloxanes), nano-pore containing materials, and air gaps.

16. The structure of claim 7 wherein the second and fourth materials are selected from the group consisting of silicon dioxide, fluoro-silicate glass, silicon nitride, silicon oxynitride ($SiO_xN_y$) and diamondlike carbon.

17. A reinforced interconnect structure, comprising:

First, second and third metal interconnects, each of the first, second and third interconnects disposed in a mechanically compliant dielectric, each of the first, second and third interconnects have a line portion and a via portion, each of the line portions of the first, second and third interconnects having a top and a bottom, each of the first, second and third interconnects having an anode section and a cathode section, wherein the via portion of the second metal interconnect is in electrical communication with the line portion of the first metal interconnection and wherein the third interconnect is in electrical communication with the second interconnect;

first and second reinforcements, each of the first and second reinforcements comprising a mechanically rigid material, the first reinforcement in contact with the via portion in the anode section of the second metal interconnect and the top of the line portion of the first interconnect, the second reinforcement in contact with the top of the line portion in the anode section of the second interconnect and the bottom of the line portion of third interconnect.

18. A reinforced interconnect structure, comprising:

First, second and third metal interconnects, each of the first, second and third interconnects disposed in a mechanically compliant dielectric, each of the first, second and third interconnects have a line portion and a via portion, each of the line portions of the first, second and third interconnects having a top and a bottom, each of the first, second and third interconnects having an anode section and a cathode section, wherein the via portion of the second metal interconnect is in electrical communication with the line portion of the first metal interconnection and wherein the third interconnect is in electrical communication with the second interconnect;

first and second reinforcements, each of the first and second reinforcements comprising a mechanically rigid material, the first reinforcement positioned in the dielectric between the first and second interconnects and the second reinforcement positioned in the dielectric between the second and the third interconnects.

* * * * *